United States Patent
Staebler

(10) Patent No.: US 6,255,794 B1
(45) Date of Patent: Jul. 3, 2001

(54) PROCEDURE FOR THE DIGITAL EVALUATION OF ANALOGUE RESOLVER OUTPUT SIGNALS

(75) Inventor: Martin Staebler, Freising (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 09/394,464

(22) Filed: Sep. 11, 1999

(30) Foreign Application Priority Data

Sep. 11, 1998 (DE) .............................................. 198 41 763

(51) Int. Cl.[7] .............................. G05B 19/31; H02K 24/00
(52) U.S. Cl. ......................... 318/605; 318/609; 318/621; 318/632
(58) Field of Search .................................... 318/600, 604, 318/605, 621, 609, 632

(56) References Cited

U.S. PATENT DOCUMENTS

| | | | |
|---|---|---|---|
| 4,529,922 | * 7/1985 | Ono ........................................ | 318/603 |
| 4,594,540 | * 6/1986 | Currie et al. ........................... | 318/661 |
| 4,795,954 | * 1/1989 | Sakurai et al. ........................ | 318/661 |
| 4,972,186 | * 11/1990 | Morris ................................. | 318/605 X |
| 5,134,397 | * 7/1992 | Eyerly et al. ...................... | 318/605 X |
| 6,084,376 | * 7/2000 | Piedl et al. ............................ | 318/600 |

* cited by examiner

*Primary Examiner*—Bentsu Ro
(74) *Attorney, Agent, or Firm*—William B. Kempler; Frederick J. Telecky, Jr.

(57) ABSTRACT

In a procedure for the digital evaluation of the analogue output signals from a resolver with at least two stator windings, arranged perpendicular to each other on a stator, and at least one rotor winding on a rotor able to rotate in relation to the stator, a sinusoidal signal is applied to the rotor winding and sine, respectively cosine shaped signals, depending on the angular position of the stator in relation to the rotor, are extracted from the stator windings. These signals are further processed after conversion into digital signals by application of the inverse tangential function, in order to compute an angular value for the relative angular position between the rotor and the stator. This angular value is affected by a propagation delay time error, which is compensated for by the introduction of a control loop. Because of the inclusion of the control loop, both the angular velocity of the rotor as well as its relative angular position can be obtained without degradation by propagation time delay errors.

19 Claims, 1 Drawing Sheet

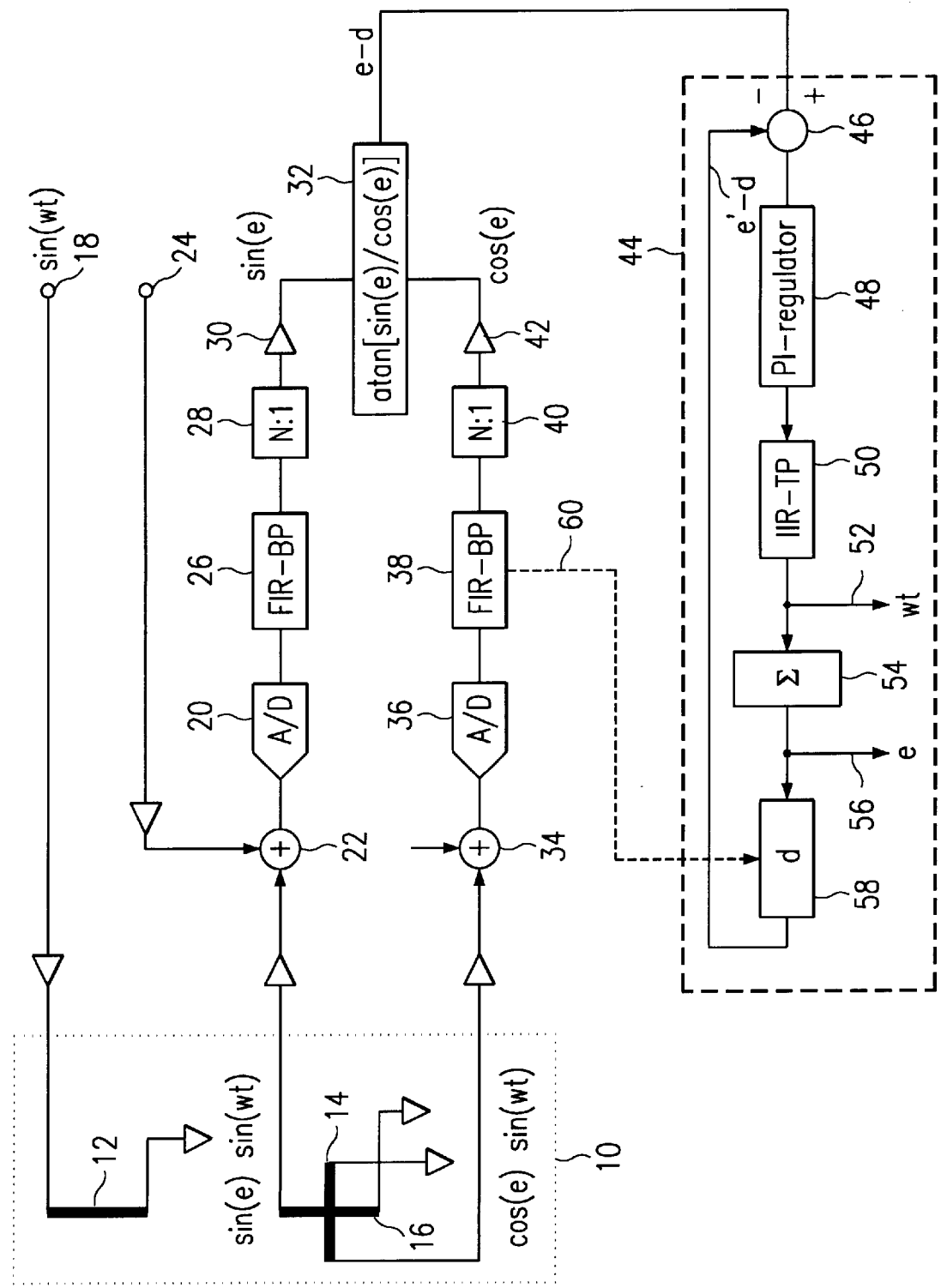

PROCEDURE FOR THE DIGITAL EVALUATION OF ANALOGUE RESOLVER OUTPUT SIGNALS

The invention relates to a procedure for the digital evaluation of analogue output signals from a resolver.

A resolver is a device which permits the acquisition of the angular position of a rotor with respect to a stator, as well as the angular velocity of the turning rotor. It is usual for the stator to have at least two stator windings, which are arranged perpendicular to each other if only two windings are provided. The rotor carries at least one rotor winding. Initially a sinusoidal excitation signal is fed to the rotor, which results in an equally sinusoidal signal to be induced in one of the stator windings, and a cosine-shaped signal in the other stator winding, on account of the relative position of the two stator windings with respect to each other. By application of the inverse tangential function it then becomes possible to determine from the two signals both the relative angle between the stator and the rotor and the angular velocity of the rotor.

With the aid of the invention a procedure is to be established which will enable a purely digital evaluation of the signals derived from the stator windings, whereby the signals representing the required angular value and the required angular velocity should be as free of interference as possible and become available without any otherwise inherent delay.

According to one aspect of the invention, for the digital evaluation of the analogue output signals from a resolver with at least two stator windings arranged perpendicular with respect to each other on one stator, and at least one rotor winding on a rotor which can turn with respect to the stator, the following steps are to be implemented:

A) a sinusoidal excitation signal is fed to the rotor winding;
B) sinusoidal and cosine-shaped signals, respectively, depending on the angular position of the stator in relation to the rotor, are derived from the stator windings and, after oversampling, are converted into digital signals;
C) for the purpose of bandwidth limiting, the digital signals are fed through an FIR bandpass filter;
D) the filtered signals are then subjected to decimation using the factor applied to the previous oversampling process;
E) by computation of the inverse tangential function, an angular value for the relative angular position between the rotor and the stator, affected by a propagation delay error due to the preceding process, is derived from the signals subjected to the decimation process;
F) the computed angular value is applied to the input of a control loop, in which
  a) the computed angular value is compared with an assumed delay-time affected angular value,
  b) the deviation between the computed angular value and the assumed angular value is applied to a PI regulator as regulation deviation value,
  c) from the applied regulation deviation, the PI regulator generates an output signal corresponding to the angular velocity of the rotor without propagation delay,
  d) the output signal is subjected to IIR filtering,
  e) the assumed angular value, not affected by delay time, is obtained from the filtered output signal by integration,
  f) the assumed angular value is delayed by the propagation time value and fed to the unit which compares it with the computed angular value,
G) the assumed angular value and the angular velocity without propagation time delay become available as the output signals of the resolver.

The process steps involved in the procedure according to the invention are steps of a nature that can be implemented as pure digital process steps. This makes it possible to have all these steps executed by a digital signal processor, which is specially programmed for the execution of these steps. An essential factor for the generation of the delay-free angular value between rotor and stator is the inclusion of a control loop which makes it possible to counteract the delay times inherent in the digital processing sequence, so that the required angular value and the required angular velocity become available without being affected by time delay.

The invention shall now be explained in greater detail, with the aid of the drawing diagram as an example, where the steps required for the individual process sequences are schematically represented.

The procedure to be described allows the output signals of a resolver 10 to be digitally processed and evaluated. The resolver 10 contains a stator winding 12 arranged on a stator, as well as a rotor winding 14 and another rotor winding 16, perpendicular to the first rotor winding, where both rotor windings are arranged on a rotor which can turn in relation to the stator. Conversely, the single winding 12 can be on the rotor with the dual windings 14, 16 on the stator. The stator winding 12 is excited by means of a sinusoidal input signal, which is applied via the input 18. The excitation signal induces signals in the rotor windings 14 and 16, which are phase-shifted by 90° with respect to each other. If, for example, the signal induced in the rotor winding 16 is a sinusoidal signal, the signal induced in the rotor winding 14 will have a cosine-shaped characteristic, which means that it is phase-shifted by 90° with respect to the sinusoidal signal. The sinusoidal output signal of the rotor winding 16 is applied, if necessary after amplification, to an analogue-to-digital converter 20, whereby, for a purpose to be explained later on, a signal may be superimposed on the input signal of this converter by means of a summing integrator 22. Such a signal may be applied via an input 24.

The analogue-to-digital converter 20 implements the conversion by the application of oversampling, in order to improve the resolution of the digitized signals. As is known, this oversampling consists in using a considerably higher sampling rate than would be required according to Nyquist. As a consequence, the converted digital signal is of a much wider spectrum than that of the original analogue signal. The output signal from the analogue-to-digital converter 20 is then clipped by the use of a digital FIR bandpass filter 26, whereby the noise signals outside the pass band are suppressed. This leads to a marked improvement of the signal-to-noise ratio of the digital signal. In unit 28 the output signals of the bandpass filter are subjected to a decimation at a decimation rate inversely proportional to the oversampling rate and, after an adjustable degree of amplification in an amplifier 30, are applied to the unit 32, the function of which shall be explained later on.

The output signal of the rotor winding 14 is processed in the same way as the output signal of the rotor winding 16, which means that it is also applied to the unit 32, after passing through a summing integrator 34, an analogue-to-digital converter 36, an FIR bandpass filter 38, a decimation unit 40 and an amplifier 42.

The amplifiers 30 and 42 are there for the purpose of equalising the amplitude of the signals fed to the unit 32.

This unit 32 determines the angle by which the stator winding 12 is displaced with respect to the rotor windings 14, 16 from the sine and cosine-shaped signals reaching it, by computing the corresponding inverse tangential value. The output value from unit 32, however, does not coincide exactly with this angle, since the preceding processing steps have caused a delay, so that the resulting angular value e is reduced by the delay value d.

A following control circuit 44 provides compensation for the delay caused by the preceding processing steps (A/D conversion and FIR filtering). The delayed angular value e–d is applied to a comparator circuit 46 within the control circuit 44, where it is compared with an assumed angular value e'–d. The resulting difference between the compared values is applied to a PI regulator 48, representing the regulation deviation value. After an IIR lowpass filtering process in filter 50, a signal wt is obtained at the output 52 of the filter 50, which represents the angular velocity of the rotor with respect to the stator, excluding the delay. By integration of this signal in an integrator 54, the angular value e' is computed which corresponds to the angle of the stator with respect to the rotor without propagation time or delay errors. This angular value is available at output 56. This signal is subjected to a delay in unit 58, whereby the delay level is set at a value which corresponds exactly to the delay experienced by the output signals of the rotor windings 14 and 16 during the process. The broken line 60 is an indication of this setting. The signal e'–d is available at the output of the delay unit 58, and is fed back to the comparator 46. Since the regulating unit always attempts to reduce the regulation deviation, that is the output signal of the comparator 46, to zero, the signal output from the PI regulator 48 is always such that, following a delay of the constant delay value d in unit 58, exactly the same signal is applied to the comparator 46 as is also output by the unit 32, which provides an angular value e which is delayed by d. What this means is that the value e', available at output 56, always corresponds exactly to the value e. The angular value between the stator and the rotor is therefore available, without time delay, at the output 56 and, in addition, the angular velocity is also available, without time delay, at output 52.

With a view to improving the signal-to-noise ratio, and therefore the resolution, a noise signal or a triangular signal may be superimposed on the input signals of the A/D converters 20 and 36 via the summing integrators 22 or 34, respectively. In the interest of adaptation to the prevailing conditions, it is also possible to modify the oversampling rate and/or the bandwidth, or the order of the digital filters 26, 38. The frequency of the excitation signal for the stator winding 12 can also be adapted to requirements.

It should be noted that the units used to process the output signals from the rotor windings 14, 16 may be embodied as software modules to enable the signals to be processed by a digital signal processor. A digital signal processor suitable for this purpose is the TMS 320 F 240 processor, produced and marketed by Texas Instruments. This component also makes it possible to generate the excitation signal applied to the stator winding 12, as it has an output at which a pulse duration modulated signal is available, which can be used to generate a sinusoidal excitation signal. Backed by the corresponding software, this processor can handle the analogue-to-digital conversion, the FIR bandpass filtering, the subsequent decimation, the amplification and division, as well as the computation of the inverse tangential value. Even the regulating circuit 44 can be realized as a software module within the same processor, so that both the angular velocity and the angular value may be generated by purely digital processing of the output signals from the rotor windings 14, 16. The programming of these functions is well known to those skilled in the art and need not be described herein. Only a small proportion of the processing power of the processor mentioned is used for this procedure, and it may be of advantage to use it simultaneously for additional purposes.

What is claimed is:

1. Method for the digital evaluation of the analogue output signals of a resolver with at least two stator windings arranged in a perpendicular position to each other on a stator, and at least one rotor winding arranged on a rotor which can turn in relation to the stator, comprising the following steps:
    A) applying a sinusoidal excitation signal to the rotor winding;
    B) deriving sinusoidal and cosine-shaped signals, respectively, depending on the angular position of the stator in relation to the rotor, from the stator windings and, after oversampling, are converted into digital signals;
    C) passing the digital signals through an FIR bandpass filter for bandwidth limiting;
    D) subjecting the filtered signals to decimation using the factor applied to the previous oversampling process;
    E) computing the inverse tangential function to derive an angular value for the relative angular position between the rotor and the stator, affected by a propagation delay error due to the preceding process, from the signals subjected to the decimation process;
    F) applying the computed angular value to the input of a control loop, in which
        a) the computed angular value is compared with an assumed delay-time affected angular value,
        b) the deviation between the computed angular value and the assumed angular value is applied to a PI regulator as regulation deviation value,
        c) from the applied regulation deviation, the PI regulator generates an output signal corresponding to the angular velocity of the rotor without propagation delay,
        d) the output signal is subjected to IIR filtering,
        e) the assumed angular value, not affected by delay time, is obtained from the filtered output signal by integration,
        f) the assumed angular value is delayed by the propagation time value and fed to the unit which compares it with the computed angular value, and
    G) the assumed angular value and the angular velocity without propagation time delay become available as the output signals of the resolver.

2. Method according to claim 1, wherein both the sine and the cosine-shaped signals are brought to the same amplitude before the inverse tangential function is computed.

3. Method according to claim 2 wherein the entire signal processing procedure is performed by one suitably programmed signal processor.

4. Method according to claim 2 wherein a noise signal is superimposed on the sine and cosine shaped signals respectively before conversion into digital signals, in order to improve the resolution.

5. Method according to claim 2 wherein where a triangular signal is superimposed on the sine and cosine shaped signals respectively before conversion into digital signals, in order to improve the resolution.

6. Method according to claim 1 wherein the entire signal processing procedure is performed by one suitably programmed signal processor.

7. Method according to claim 6 wherein a noise signal is superimposed on the sine and cosine shaped signals respectively before conversion into digital signals, in order to improve the resolution.

8. Method according to claim 6 wherein where a triangular signal is superimposed on the sine and cosine shaped signals respectively before conversion into digital signals, in order to improve the resolution.

9. Method according to claim 1 wherein a noise signal is superimposed on the sine and cosine shaped signals respectively before conversion into digital signals, in order to improve the resolution.

10. Method according to claim 9 wherein where a triangular signal is superimposed on the sine and cosine shaped signals respectively before conversion into digital signals, in order to improve the resolution.

11. Method according to claim 1 wherein where a triangular signal is superimposed on the sine and cosine shaped signals respectively before conversion into digital signals, in order to improve the resolution.

12. Method for the digital evaluation of the analogue output signals of a resolver with at least two rotor windings arranged in a perpendicular position to each other on a rotor, and at least one stator winding arranged on a stator therefor being able to turn in relation to the rotor, comprising the following steps:

A) applying a sinusoidal excitation signal to the stator winding;

B) deriving sinusoidal and cosine-shaped signals, respectively, depending on the angular position of the rotor in relation to the stator, from the rotor windings and, after oversampling, are converted into digital signals;

C) passing the digital signals through an FIR bandpass filter for bandwidth limiting;

D) subjecting the filtered signals to decimation using the factor applied to the previous oversampling process;

E) computing the inverse tangential function to derive an angular value for the relative angular position between the rotor and the strator, affected by a propagation delay error due to the preceding process, from the signals subjected to the decimation process;

F) applying the computed angular value to the input of a control loop, in which
   a) the computed angular value is compared with an assumed delay-time affected angular value,
   b) the deviation between the computed angular value and the assumed angular value is applied to a PI regulator as regulation deviation value,
   c) from the applied regulation deviation, the PI regulator generates an output signal corresponding to the angular velocity of the rotor without propagation delay,
   d) the output signal is subjected to IIR filtering,
   e) the assumed angular value, not affected by delay time, is obtained from the filtered output signal by integration,
   f) the assumed angular value is delayed by the propagation time value and fed to the unit which compares it with the computed angular value, and G) the assumed angular value and the angular velocity without propagation time delay become available as the output signals of the resolver.

13. Method according to claim 12, wherein both the sine and the cosine-shaped signals are brought to the same amplitude before the inverse tangential function is computed.

14. Method according to claim 13 wherein the entire signal processing procedure is performed by one suitably programmed signal processor.

15. Method according to claim 13 wherein a noise signal is superimposed on the sine and cosine shaped signals respectively before conversion into digital signals, in order to improve the resolution.

16. Method according to claim 13 wherein where a triangular signal is superimposed on the sine and cosine shaped signals respectively before conversion into digital signals, in order to improve the resolution.

17. Method according to claim 12 wherein the entire signal processing procedure is performed by one suitably programmed signal processor.

18. Method according to claim 12 wherein a noise signal is superimposed on the sine and cosine shaped signals respectively before conversion into digital signals, in order to improve the resolution.

19. Method according to claim 12 wherein where a triangular signal is superimposed on the sine and cosine shaped signals respectively before conversion into digital signals, in order to improve the resolution.

* * * * *